(12) United States Patent
Zhao

(10) Patent No.: US 11,075,229 B2
(45) Date of Patent: Jul. 27, 2021

(54) FOLDALBE DISPLAY SCREEN AND METHOD FOR MANUFACTURING SAME

(71) Applicant: WUHAN CHINA STAR OPTOELECTRONICS SEMICONDUCTOR DISPLAY TECHNOLOGY CO., LTD., Wuhan (CN)

(72) Inventor: Jinrong Zhao, Wuhan (CN)

( * ) Notice: Subject to any disclaimer, the term of this patent is extended or adjusted under 35 U.S.C. 154(b) by 309 days.

(21) Appl. No.: 16/336,107

(22) PCT Filed: Nov. 15, 2018

(86) PCT No.: PCT/CN2018/115545
§ 371 (c)(1),
(2) Date: Mar. 24, 2019

(87) PCT Pub. No.: WO2020/073419
PCT Pub. Date: Apr. 16, 2020

(65) Prior Publication Data
US 2021/0183910 A1   Jun. 17, 2021

Related U.S. Application Data

(63) Continuation of application No. PCT/CN2018/115545, filed on Nov. 15, 2018.

(30) Foreign Application Priority Data

Oct. 12, 2018   (CN) .......................... 201811188420.1

(51) Int. Cl.
*H01L 27/12*   (2006.01)

(52) U.S. Cl.
CPC ........ *H01L 27/1248* (2013.01); *H01L 27/124* (2013.01); *H01L 27/1244* (2013.01); *H01L 27/1259* (2013.01)

(58) Field of Classification Search
None
See application file for complete search history.

(56) References Cited

U.S. PATENT DOCUMENTS

| | | | |
|---|---|---|---|
| 2012/0133278 A1 | 5/2012 | Ryu | |
| 2018/0090518 A1* | 3/2018 | Kim | ................... H01L 27/3248 |
| 2018/0366586 A1* | 12/2018 | Son | ..................... H01L 27/3276 |
| 2020/0027903 A1* | 1/2020 | Tian | .................... H01L 27/1248 |

(Continued)

FOREIGN PATENT DOCUMENTS

| | | |
|---|---|---|
| CN | 108008583 A | 5/2018 |
| CN | 108598287 A | 9/2018 |

*Primary Examiner* — Evren Seven

(57) ABSTRACT

The present disclosure provides a foldable display screen and a method for manufacturing same. The foldable display screen includes a substrate; a plurality of inorganic layers disposed on the substrate; a patterned metal layer sandwiched between any two of the inorganic layers; a first through-hole and a second through-hole disposed in the inorganic layers, wherein the first through-hole is disposed on the patterned metal layer, the second through-hole is positioned between two adjacent patterned metal layers, and a footprint of the first through-hole is smaller than a footprint of the patterned metal layer; and a patterned organic layer disposed on the inorganic layers to fill up the first through-hole and the second through-hole.

3 Claims, 3 Drawing Sheets

(56) References Cited

U.S. PATENT DOCUMENTS

| | | | | |
|---|---|---|---|---|
| 2020/0194469 A1* | 6/2020 | Hu | ................... | H01L 27/1218 |
| 2020/0243778 A1* | 7/2020 | Li | ................... | H01L 27/3258 |
| 2020/0388666 A1* | 12/2020 | Park | ................ | H01L 27/1244 |

\* cited by examiner

FOLDALBE DISPLAY SCREEN AND METHOD FOR MANUFACTURING SAME

FIELD OF INVENTION

The present disclosure relates to a field in display technology, and more particularly to a foldable display screen and a method for manufacturing same.

BACKGROUND

Smart phones are getting more and more popular over the last recent decade. Technology development of essential components (e.g., display screens) in smart phones notably influences the trend of smart phones. For example, smart phones have changed from having liquid crystal displays (LCDs) in early phases to having organic light emitting diode (OLED) displays nowadays, and design of the structure of smart phones has changed from having planar display screens to having foldable display screens. In terms of design of structure, foldable display screens are much more complicated than planar display screens. Certainly, stress effects on display screen layers, which are caused during folding processes, have to be taken into consideration in technology development of smart phones.

In case that stress, which is generated during folding processes and builds up on layers of display screens, is too large or cannot be effectively released, layers are liable to crack, and electrical properties of thin film transistors (TFTs) in display screens would be worsened. This further affects display quality and reliability of displays. Because inorganic layers (such as buffer layer, gate insulation layer, interlayer dielectric layer, and etc.) are fragile, they tend to crack during folding processes. Generally, cracks extend from outside of display screens towards inside of display screens. If cracks extend to reach function areas of display screens, such as thin film encapsulation (TFE) area, electrostatic discharge (ESD) area, gate driver on array (GOA) area, active area, and etc., abnormalities including wiring defection, TFE failure, black spots, black areas, or defective images would occur, and thus display quality of display screens is deteriorated.

Therefore, there is a need to provide a foldable display screen and a method for manufacturing same in order to solve above-said problems existing in prior art.

SUMMARY OF DISCLOSURE

The present disclosure provides a foldable display screen and a method for manufacturing same, which includes a stacked structure composed of a metal layer, an inorganic layer, and an organic layer to effectively release stress, in order to solve above-said problems existing in prior art where cracks are generated in display screens and display quality of display screens is poor.

To solve the aforementioned problems, the present disclosure provides a foldable display screen, comprising:
a substrate;
a plurality of inorganic layers disposed on the substrate;
a patterned metal layer sandwiched between any two of the inorganic layers;
a first through-hole and a second through-hole disposed in the inorganic layers, wherein the first through-hole is located on the patterned metal layer, the second through-hole is positioned between two adjacent patterned metal layers, and a footprint of the first through-hole is smaller than a footprint of the patterned metal layer; and
a patterned organic layer disposed on the inorganic layers to fill up the first through-hole and the second through-hole;
wherein the patterned organic layer includes an elongated portion, or the patterned organic layer includes a plurality of shortened portions; and
wherein the patterned metal layer, the first through-hole, the second through-hole, and the patterned organic layer are located in a gate driver on array (GOA) area or a peripheral border area of the foldable display screen.

In accordance with one preferred embodiment of the present disclosure, the patterned metal layer is made of molybdenum, molybdenum/aluminum, or molybdenum/aluminum/molybdenum, and the patterned organic layer is made of an organic photoresist polymer.

In accordance with one preferred embodiment of the present disclosure, the inorganic layers comprise a buffer layer, a first gate insulation layer, a second gate insulation layer, and an interlayer dielectric layer sequentially disposed on the substrate from bottom to top; and the patterned metal layer is disposed on the first gate insulation layer; and the patterned metal layer is sandwiched between the first gate insulation layer and the second gate insulation layer, or between the second gate insulation layer and the interlayer dielectric layer, or between the first gate insulation layer and the interlayer dielectric layer.

In addition, the present disclosure provides a foldable display screen, comprising:
a substrate;
a plurality of inorganic layers disposed on the substrate;
a patterned metal layer sandwiched between any two of the inorganic layers;
a first through-hole and a second through-hole disposed in the inorganic layers, wherein the first through-hole is located on the patterned metal layer, the second through-hole is positioned between two adjacent patterned metal layers, and a footprint of the first through-hole is smaller than a footprint of the patterned metal layer; and
a patterned organic layer disposed on the inorganic layers to fill up the first through-hole and the second through-hole.

In accordance with one preferred embodiment of the present disclosure, the patterned organic layer includes an elongated portion.

In accordance with one preferred embodiment of the present disclosure, the patterned organic layer includes a plurality of shortened portions.

In accordance with one preferred embodiment of the present disclosure, the patterned metal layer is made of molybdenum, molybdenum/aluminum, or molybdenum/aluminum/molybdenum, and the patterned organic layer is made of an organic photoresist polymer; and the patterned metal layer, the first through-hole, the second through-hole, and the patterned organic layer are located in a gate driver on array (GOA) area or a peripheral border area of the foldable display screen.

In accordance with one preferred embodiment of the present disclosure, the inorganic layers comprise a buffer layer, a first gate insulation layer, a second gate insulation layer, and an interlayer dielectric layer sequentially disposed on the substrate from bottom to top; and the patterned metal layer is disposed on the first gate insulation layer; and the patterned metal layer is sandwiched between the first gate insulation layer and the second gate insulation layer, or between the second gate insulation layer and the interlayer dielectric layer, or between the first gate insulation layer and the interlayer dielectric layer.

Furthermore, the present disclosure provides a method for manufacturing a foldable display screen, comprising steps of:

providing a substrate;

forming a plurality of inorganic layers and a patterned metal layer on the substrate, wherein the patterned metal layer is sandwiched between any two of the inorganic layers;

forming a first through-hole and a second through-hole in the inorganic layers, wherein the first through-hole is formed on the patterned metal layer, the second through-hole is formed to be positioned between two adjacent patterned metal layers, and a footprint of the first through-hole is smaller than a footprint of the patterned metal layer; and forming a patterned organic layer on the inorganic layers, wherein the patterned organic layer fills up the first through-hole and the second through-hole.

In accordance with one preferred embodiment of the present disclosure, the patterned organic layer includes an elongated portion.

In accordance with one preferred embodiment of the present disclosure, the patterned organic layer includes a plurality of shortened portions.

In accordance with one preferred embodiment of the present disclosure, the patterned metal layer is made of molybdenum, molybdenum/aluminum, or molybdenum/aluminum/molybdenum, and the patterned organic layer is made of an organic photoresist polymer; and the patterned metal layer, the first through-hole, the second through-hole, and the patterned organic layer are located in a gate driver on array (GOA) area or a peripheral border area of the foldable display screen.

In accordance with one preferred embodiment of the present disclosure, forming the inorganic layers comprises a step of: sequentially forming a buffer layer, a first gate insulation layer, a second gate insulation layer, and an interlayer dielectric layer on the substrate; and the patterned metal layer is formed on the first gate insulation layer; and the patterned metal layer is sandwiched between the first gate insulation layer and the second gate insulation layer, or between the second gate insulation layer and the interlayer dielectric layer, or between the first gate insulation layer and the interlayer dielectric layer.

Compared with prior art, the present disclosure provides a foldable display screen and a method for manufacturing same. The present disclosure is characterized by utilizing water/oxygen blocking property of inorganic layers, and utilizing toughness and stress resistance properties of metal layer and organic layer that are better than those of inorganic layers, and forming patterned metal layer and organic layer in inorganic layers, so as to avoid occurrence of cracks that are generated in inorganic layers as stress builds up on inorganic layers during folding process of display screens. According to the subject invention, even if organic layers might crack during folding process of display screens, the organic layers formed inside the through-holes can prevent cracks from extending towards function areas of display screens. Accordingly, the present disclosure improves display quality and reliability of display screens.

DETAILED DESCRIPTION

Figure 1A:
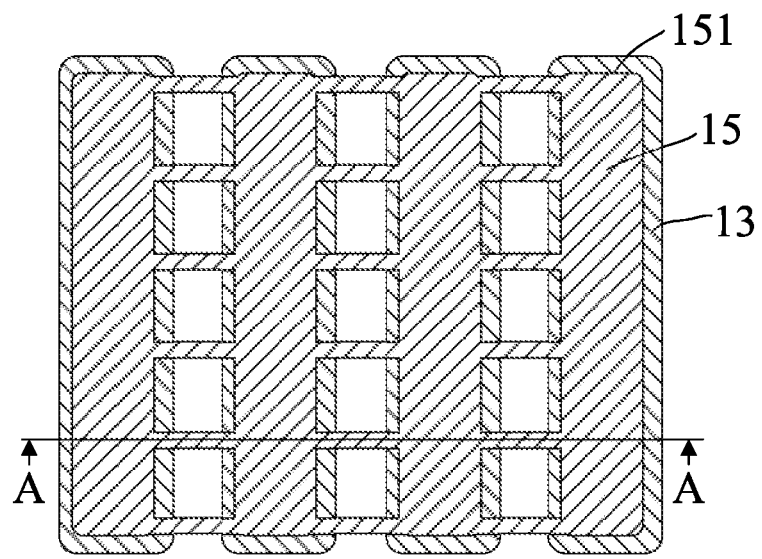
FIG. 1A is a top-view of a foldable display screen according to a first embodiment of the present disclosure, wherein organic layer disposed above inorganic layers is omitted except for the organic layer filling up the first through-hole and the second through-hole, and inorganic layers are omitted, in order to clearly show a layer structure of the foldable display screen.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

The present disclosure is characterized by utilizing water/oxygen blocking properties of inorganic layers, toughness and stress resistance properties of metal layers and organic layer that are better than those of inorganic layers, and by forming patterned metal layer and organic layer in inorganic layers, so as to avoid occurrence of cracks that are generated in inorganic layers as stress builds up on inorganic layers during folding process of display screens.

Figure 1B:
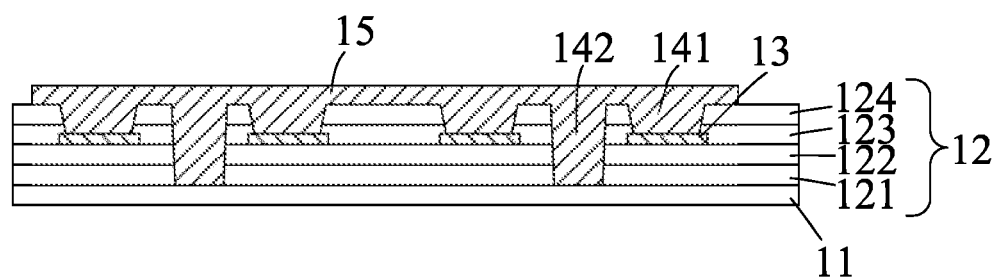
FIG. 1B is a cross-sectional view taken along line A-A of FIG. 1A.

Please refer to FIGS. 1A and 1B. FIG. 1A is a top-view of a foldable display screen according to a first embodiment of the present disclosure, wherein organic layer 15 disposed above inorganic layers 12 is omitted except for the organic layer 15 filling up the first through-hole 141 and the second through-hole 142, and inorganic layers 12 are omitted, in order to clearly show a layer structure of the foldable display screen. FIG. 1B is a cross-sectional view taken along line A-A of FIG. 1A.

As shown in FIG. 1B, the present disclosure provides a foldable display screen. The foldable display screen includes a substrate 11, a plurality of inorganic layers 12, a patterned metal layer 13, a first through-hole 141, a second through-hole 142, and a patterned organic layer 15.

The inorganic layers 12 are disposed on the substrate 11.

The patterned metal layer 13 is sandwiched between any two of the inorganic layers 12, e.g., between an inorganic layer 122 and an inorganic layer 124. According to the present disclosure, the patterned metal layer 13 viewed from the top of the display screen has a rectangle-like shape. That is, the patterned metal layer 13 is stripe-shaped, as shown in FIG. 1A.

The first through-hole 141 and the second through-hole 142 are disposed in the inorganic layers 12. The first through-hole 141 is located on the patterned metal layer 13, the second through-hole 142 is positioned between two adjacent patterned metal layers 13, and a footprint of the first through-hole 141 is smaller than a footprint of the patterned metal layer 13.

The patterned organic layer 15 is disposed on the inorganic layers 12 to fill up the first through-hole 141 and the second through-hole 142.

As shown in FIG. 1A, in this embodiment, the patterned organic layer 15 includes an elongated portion 151. The elongated portion 151 fills up the first through-hole 141, as shown in FIG. 1B.

In this embodiment, only one first through-hole 141 is disposed on each of the patterned metal layers 13. Longitudinal length of the first through-hole 141 is nearly the same as longitudinal length of the patterned metal layer 13 on which the first through-hole 141 is disposed. Therefore, as the patterned organic layer 15 fills up the first through-hole 141 (see FIG. 1B), it means that the patterned organic layer 15 includes an elongated portion 151 (see FIG. 1A).

Preferably, the substrate 11 is a polymer substrate or a substrate made of other similar materials (such as a polyimide substrate). The substrate 11 can sustain the whole manufacturing process of display screens.

In one implementation, all the above-mentioned layers are located in a function area of the foldable display screen. In other words, the patterned metal layer 13, the first through-hole 141, the second through-hole 142, and the patterned organic layer 15 are all disposed in the function area of the foldable display screen. The function area could be a gate driver on array (GOA) area or a peripheral border area of the foldable display screen. However, the function area is not limited thereto. As long as the function areas where the above-mentioned layers are located can avoid crack extending from outside of display screen towards inside of display screen, such function areas fall within scope of the subject invention.

The patterned metal layer 13 could be made of molybdenum, molybdenum/aluminum, or molybdenum/aluminum/molybdenum. The patterned organic layer 15 could be made of an organic photoresist polymer.

Preferably, the inorganic layers 12 comprise a buffer layer 121, a first gate insulation layer 122, a second gate insulation layer 123, and an interlayer dielectric layer 124 sequentially disposed on the substrate 11 from bottom to top. The patterned metal layer 13 is disposed on the first gate insulation layer 122. The patterned metal layer 13 is sandwiched between the first gate insulation layer 122 and the second gate insulation layer 123, or between the second gate insulation layer 123 and the interlayer dielectric layer 124, or between the first gate insulation layer 122 and the interlayer dielectric layer 124.

Figure 2A:
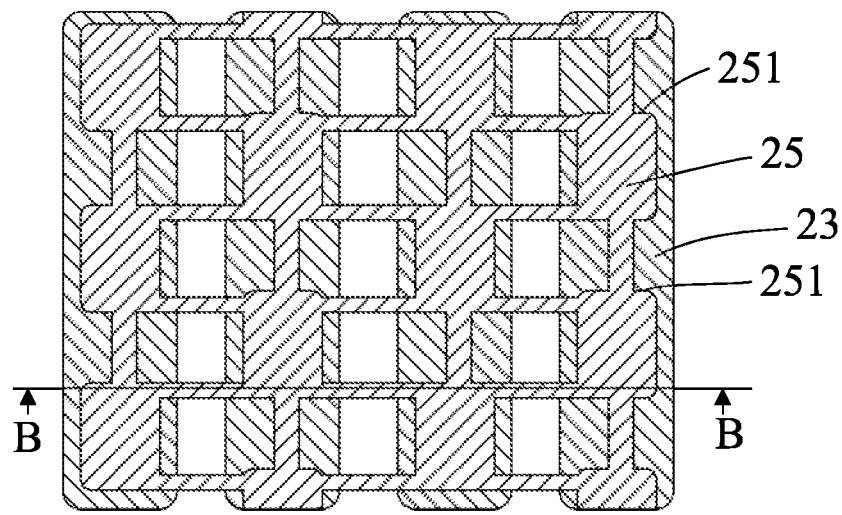
FIG. 2A is a top-view of a foldable display screen according to a second embodiment of the present disclosure, wherein organic layer disposed above inorganic layers is omitted except for the organic layer filling up the first through-hole and the second through-hole, and inorganic layers are omitted, in order to clearly show a layer structure of the foldable display screen.
Figure 2B:
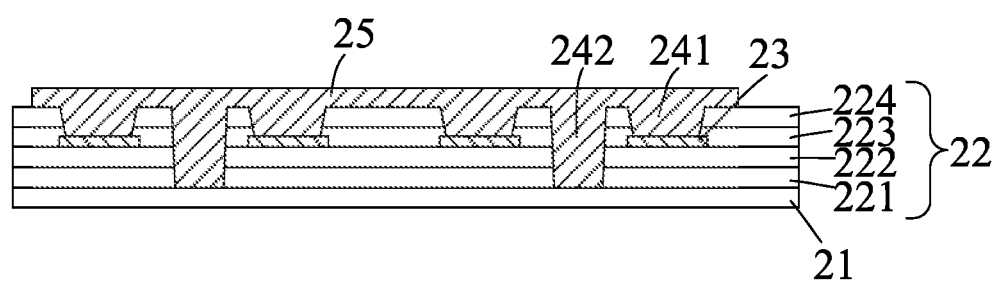
FIG. 2B is a cross-sectional view taken along line B-B of FIG. 2A.

In addition, please refer to FIGS. 2A and 2B. FIG. 2A is a top-view of a foldable display screen according to a second embodiment of the present disclosure, wherein organic layer 25 disposed above inorganic layers 22 is omitted except for the organic layer 25 filling up the first through-hole 241 and the second through-hole 242, and inorganic layers 22 are omitted, in order to clearly show a layer structure of the foldable display screen. FIG. 2B is a cross-sectional view taken along line B-B of FIG. 2A.

As shown in FIG. 2B, the present disclosure further provides a foldable display screen. The foldable display screen includes a substrate 21, a plurality of inorganic layers 22, a patterned metal layer 23, a first through-hole 241, a second through-hole 242, and a patterned organic layer 25.

The inorganic layers 22 are disposed on the substrate 21.

The patterned metal layer 23 is sandwiched between any two of the inorganic layers 22, e.g., between an inorganic layer 222 and an inorganic layer 224. According to the present disclosure, the patterned metal layer 23 viewed from the top of the display screen has a rectangle-like shape. That is, the patterned metal layer 23 is stripe-shaped, as shown in FIG. 2A.

The first through-hole 241 and the second through-hole 242 are disposed in the inorganic layers 22. The first through-hole 241 is located on the patterned metal layer 23, the second through-hole 242 is positioned between two adjacent patterned metal layers 23, and a footprint of the first through-hole 241 is smaller than a footprint of the patterned metal layer 23.

The patterned organic layer 25 is disposed on the inorganic layers 22 to fill up the first through-hole 241 and the second through-hole 242.

This second embodiment differs from the above-mentioned first embodiment in that, a plurality of first through-holes 241 are disposed on each of the patterned metal layers 23. Longitudinal length of the first through-hole 241 in this second embodiment is shorter than longitudinal length of the first through-hole 141 in the above-mentioned first embodiment. Therefore, as the patterned organic layer 25 fills up the first through-hole 241 (see FIG. 2B), it means that the patterned organic layer 25 includes a plurality of shortened portions 251 (see FIG. 2A). Moreover, because the size of the first through-hole 241 and the size of the second through-hole 242 are not so different (or the size of the first through-hole 241 and the size of the second through-hole 242 are much more similar to each other) in this second embodiment comparing with the above first embodiment, it would be much easier to control etching uniformity of inorganic layers during formation of the first through-hole 241 and the second through-hole 242.

Preferably, the substrate 21 is a polymer substrate or a substrate made of other similar materials (such as a polyimide substrate). The substrate 21 can sustain the whole manufacturing process of display screens.

In one implementation, all the above-mentioned layers are located in a function area of foldable display screen. In other words, the patterned metal layer 23, the first through-hole 241, the second through-hole 242, and the patterned organic layer 25 are all disposed in the function area of a foldable display screen. The function area could be a gate driver on array (GOA) area or a peripheral border area of the foldable display screen. However, the function area is not limited thereto. As long as the function area where the above-mentioned layers are located can prevent cracks from extending from outside of the display screen towards inside of the display screen, such function area falls within scope of the subject invention.

The patterned metal layer 23 could be made of molybdenum, molybdenum/aluminum, or molybdenum/aluminum/molybdenum. The patterned organic layer 25 could be made of an organic photoresist polymer.

Preferably, the inorganic layers 22 comprises a buffer layer 221, a first gate insulation layer 222, a second gate insulation layer 223, and an interlayer dielectric layer 224 sequentially disposed on the substrate 21 from bottom to top. The patterned metal layer 23 is disposed on the first gate insulation layer 222. The patterned metal layer 23 is sandwiched between the first gate insulation layer 222 and the second gate insulation layer 223, or between the second gate insulation layer 223 and the interlayer dielectric layer 224, or between the first gate insulation layer 222 and the interlayer dielectric layer 224.

Figure 3:
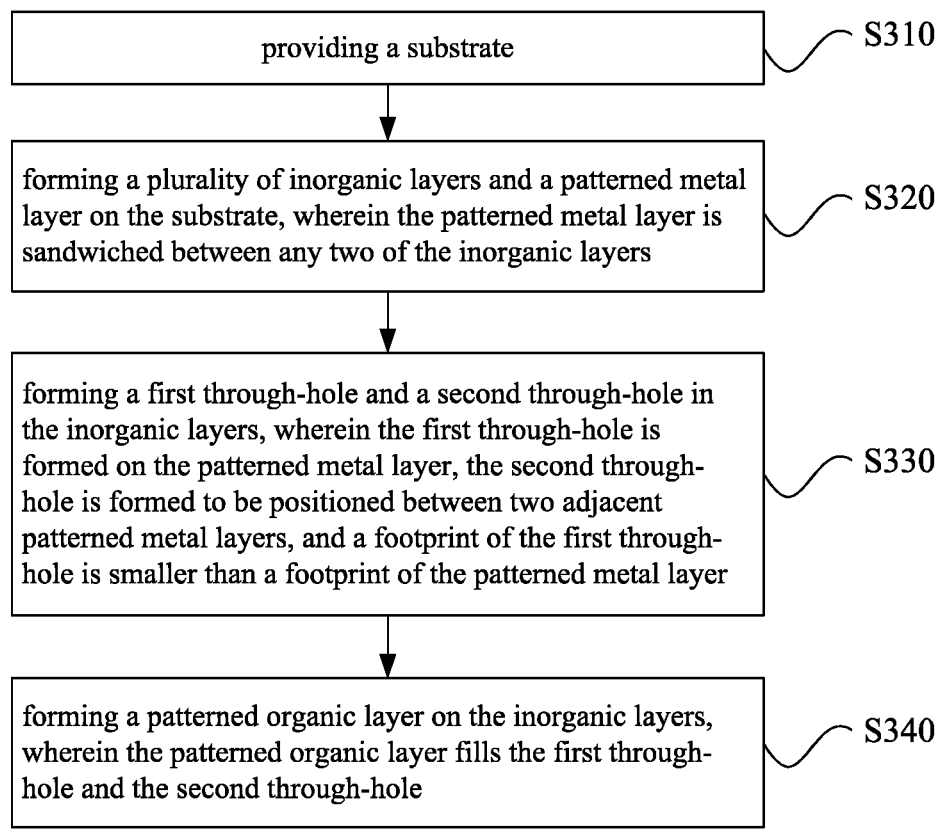
FIG. 3 shows a flowchart of a method for manufacturing a foldable display screen according to one preferred embodiment of the present disclosure.

Please refer to FIG. 3. FIG. 3 shows a flowchart of a method for manufacturing a foldable display screen according to one preferred embodiment of the present disclosure. The method includes:

a step S310 of providing a substrate;

a step S320 of forming a plurality of inorganic layers and a patterned metal layer on the substrate, wherein the patterned metal layer is sandwiched between any two of the inorganic layers;

a step S330 of forming a first through-hole and a second through-hole in the inorganic layers, wherein the first through-hole is formed on the patterned metal layer, the second through-hole is formed to be positioned between two adjacent patterned metal layers, and a footprint of the first through-hole is smaller than a footprint of the patterned metal layer; and a step S340 of forming a patterned organic layer on the inorganic layers, wherein the patterned organic layer fills up the first through-hole and the second through-hole.

In this embodiment, the patterned organic layer 15 includes an elongated portion 151 (see FIG. 1A), or the patterned organic layer 25 includes a plurality of shortened portions 251 (See FIG. 2A).

In one implementation, all the above-mentioned layers are located in a function area of foldable display screen. In other words, the patterned metal layer, the first through-hole, the second through-hole, and the patterned organic layer are all disposed in the function area of foldable display screen. The function area could be a gate driver on array (GOA) area or a peripheral border area of the foldable display screen. However, the function area is not limited thereto. As long as the function areas where the above-mentioned layers are located can avoid crack extending from outside of display screen towards inside of display screen, such function areas fall within scope of the subject invention.

The patterned metal layer could be formed using physical vapor deposition (PVD), photolithography, and etching treatment. The patterned metal layer could be made of molybdenum, molybdenum/aluminum, or molybdenum/aluminum/molybdenum. The patterned organic layer could be formed using coating techniques and photolithography techniques. The patterned organic layer could be made of an organic photoresist polymer.

In one implementation, forming the inorganic layers comprises a step of sequentially forming a buffer layer, a first gate insulation layer, a second gate insulation layer, and an interlayer dielectric layer on the substrate. Additionally, the patterned metal layer is formed on the first gate insulation layer. The patterned metal layer is sandwiched between the first gate insulation layer and the second gate insulation layer, or between the second gate insulation layer and the interlayer dielectric layer, or between the first gate insulation layer and the interlayer dielectric layer.

Compared with prior art, the present disclosure provides a foldable display screen and a method for manufacturing same. The present disclosure is characterized by utilizing water/oxygen blocking property of inorganic layers, and utilizing toughness and stress resistance properties of metal layer and organic layer that are better than those of inorganic layers, and forming patterned metal layer and organic layer in inorganic layers, so as to avoid occurrence of cracks that are generated in inorganic layers as stress builds up on inorganic layers during folding process of display screens. According to the subject invention, even if organic layers might crack during folding process of display screens, the organic layers formed inside the through-holes can prevent cracks from extending towards function areas of display screens. Accordingly, the present disclosure improves display quality and reliability of display screens.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A foldable display screen, comprising:
   a substrate;
   a plurality of inorganic layers disposed on the substrate;
   a patterned metal layer sandwiched between any two of the inorganic layers;
   a first through-hole and a second through-hole disposed in the inorganic layers, wherein the first through-hole is located on the patterned metal layer, the second through-hole is positioned between two adjacent patterned metal layers, and a footprint of the first through-hole is smaller than a footprint of the patterned metal layer; and
   a patterned organic layer disposed on the inorganic layers to fill up the first through-hole and the second through-hole;
   wherein the patterned organic layer includes an elongated portion, or the patterned organic layer includes a plurality of shortened portions; and
   wherein the patterned metal layer, the first through-hole, the second through-hole, and the patterned organic layer are located in a gate driver on array (GOA) area or a peripheral border area of the foldable display screen.

2. The foldable display screen according to claim 1, wherein the patterned metal layer is made of molybdenum, molybdenum/aluminum, or molybdenum/aluminum/molybdenum, and the patterned organic layer is made of an organic photoresist polymer.

3. The foldable display screen according to claim 1, wherein
   the inorganic layers comprise a buffer layer, a first gate insulation layer, a second gate insulation layer, and an interlayer dielectric layer sequentially disposed on the substrate from bottom to top; and
   the patterned metal layer is disposed on the first gate insulation layer; and the patterned metal layer is sandwiched between the first gate insulation layer and the second gate insulation layer, or between the second gate insulation layer and the interlayer dielectric layer, or between the first gate insulation layer and the interlayer dielectric layer.

* * * * *